United States Patent
Takegoshi et al.

(10) Patent No.: US 9,536,752 B2
(45) Date of Patent: Jan. 3, 2017

(54) SLURRY FOR CHEMICAL MECHANICAL POLISHING AND POLISHING METHOD FOR SUBSTRATE USING SAME

(75) Inventors: Minori Takegoshi, Okayama (JP); Mitsuru Kato, Okayama (JP); Chihiro Okamoto, Okayama (JP); Shinya Kato, Okayama (JP)

(73) Assignee: KURARAY CO., LTD., Kurashiki-shi (JP)

(*) Notice: Subject to any disclaimer, the term of this patent is extended or adjusted under 35 U.S.C. 154(b) by 123 days.

(21) Appl. No.: 13/508,924

(22) PCT Filed: Nov. 8, 2010

(86) PCT No.: PCT/JP2010/069851
§ 371 (c)(1),
(2), (4) Date: Jun. 28, 2012

(87) PCT Pub. No.: WO2011/058952
PCT Pub. Date: May 19, 2011

(65) Prior Publication Data
US 2012/0270400 A1 Oct. 25, 2012

(30) Foreign Application Priority Data
Nov. 11, 2009 (JP) ................. 2009-258444

(51) Int. Cl.
*C09G 1/02* (2006.01)
*H01L 21/306* (2006.01)
(Continued)

(52) U.S. Cl.
CPC ........... *H01L 21/31053* (2013.01); *C09G 1/02* (2013.01); *C09K 3/1463* (2013.01); *H01L 21/76224* (2013.01)

(58) Field of Classification Search
CPC ..................... C09G 1/02; H01L 21/30625
(Continued)

(56) References Cited

U.S. PATENT DOCUMENTS 6,019,806 A 2/2000 Sees et al.
6,436,835 B1 8/2002 Kido et al.
(Continued)

FOREIGN PATENT DOCUMENTS

CN 1854225 A 11/2006
CN 1919955 A 2/2007
(Continued)

OTHER PUBLICATIONS

"Cyclodextrins", Magnusdottir et al., J. Incl. Phenom. Macro. Chem. 44. 213-218.2002).*

(Continued)

*Primary Examiner* — Thomas Pham
(74) *Attorney, Agent, or Firm* — Oblon, McClelland, Maier & Neustadt, L.L.P.

(57) ABSTRACT

The present invention provides a slurry for chemical mechanical polishing comprising water-soluble clathrate compound (a), polymer compound (b) having an acidic group optionally in a salt form as a side chain, polishing abrasive grain (c) and water (d), wherein the content of the water-soluble clathrate compound (a) is 0.001 mass %-3 mass % of the total amount of the slurry, the polymer compound (b) has a weight average molecular weight of not less than 1,000 and less than 1,000,000, and the content of the polymer compound (b) is 0.12 mass %-3 mass % of the total amount of the slurry, and a polishing method for substrate using the slurry.

8 Claims, 2 Drawing Sheets

(51) Int. Cl.
*H01L 21/3105* (2006.01)
*C09K 3/14* (2006.01)
*H01L 21/762* (2006.01)

(58) Field of Classification Search
USPC .......................................................... 438/692
See application file for complete search history.

(56) References Cited

U.S. PATENT DOCUMENTS

| | | | |
|---|---|---|---|
| 6,783,434 B1 | 8/2004 | Akahori et al. | |
| 2002/0039875 A1* | 4/2002 | Kobayashi et al. | 451/36 |
| 2002/0045350 A1 | 4/2002 | Kido et al. | |
| 2004/0147206 A1 | 7/2004 | Akahori et al. | |
| 2005/0118820 A1 | 6/2005 | Akahori et al. | |
| 2005/0269295 A1 | 12/2005 | Akahori et al. | |
| 2006/0186372 A1 | 8/2006 | Akahori et al. | |
| 2006/0197054 A1 | 9/2006 | Akahori et al. | |
| 2006/0243702 A1 | 11/2006 | Minamihaba et al. | |
| 2007/0049180 A1 | 3/2007 | Shida et al. | |
| 2007/0167116 A1* | 7/2007 | Yoshida et al. | 451/41 |
| 2007/0210278 A1 | 9/2007 | Lane et al. | |
| 2007/0254485 A1* | 11/2007 | Mao et al. | 438/692 |
| 2008/0003924 A1* | 1/2008 | Kurata et al. | 451/36 |
| 2009/0176372 A1* | 7/2009 | Minamihaba et al. | 438/693 |
| 2009/0221213 A1 | 9/2009 | Namie et al. | |
| 2009/0246699 A1* | 10/2009 | Sonokawa | 430/302 |
| 2010/0009540 A1* | 1/2010 | Kamiya | C09K 3/1463 438/693 |
| 2010/0221918 A1* | 9/2010 | Takemura et al. | 438/693 |
| 2011/0045741 A1 | 2/2011 | Ahn et al. | |
| 2011/0062374 A1 | 3/2011 | Minamihaba et al. | |
| 2011/0081780 A1* | 4/2011 | Shida et al. | 438/693 |
| 2011/0117821 A1* | 5/2011 | Nishimoto et al. | 451/36 |

FOREIGN PATENT DOCUMENTS

| | | |
|---|---|---|
| EP | 0 853 110 | 7/1998 |
| EP | 1 148 538 A1 | 10/2001 |
| JP | 10-233378 | 9/1998 |
| JP | 2007-13059 A | 1/2007 |
| JP | 2007-242839 | 9/2007 |
| JP | 2008-118104 | 5/2008 |
| JP | 2008-539581 A | 11/2008 |
| JP | 2009-224771 A | 10/2009 |
| JP | 2009-302255 | 12/2009 |
| JP | 2012-109287 | 6/2012 |
| TW | 200938604 | 9/2009 |
| TW | 200944583 | 11/2009 |
| WO | WO 2008/044477 A1 | 4/2008 |
| WO | 2009/031389 | 3/2009 |
| WO | WO 2009/104517 A1 | 8/2009 |
| WO | WO 2009104517 A1 * | 8/2009 |
| WO | 2009/119178 | 10/2009 |

OTHER PUBLICATIONS

"Gelatin2", webpage by Sigma-Aldrich, No date found.*
European Search Report issued Jul. 4, 2013 in Patent Application No. 10 82 9911.
Japanese Patent Office, International Search Report in International Patent Application No. PCT/JP2010/069851 (Jan. 18, 2011).
Office Action as received in the corresponding Chinese Patent Application No. 201080051174.0 dated Feb. 28, 2014 w/English Translation.
Mold Manufacturing Technology and Equipment, Sun Fengqin, China Machine Press, p. 135, Oct. 1999 (No English Translation available).
Office Action as received in the corresponding Japanese Patent Application No. 2011-540500 dated Mar. 10, 2015.
Office Action as received in the corresponding Taiwanese Patent Application No. 99138787 dated Mar. 2, 2015.
Decision to grant patent dated Jan. 5, 2016 as received in the corresponding Japanese Patent Application No. 2011-540500.

* cited by examiner

SLURRY FOR CHEMICAL MECHANICAL POLISHING AND POLISHING METHOD FOR SUBSTRATE USING SAME

CROSS-REFERENCE TO RELATED APPLICATIONS

This patent application is the U.S. national phase of International Patent Application No. PCT/JP2010/069851, filed Nov. 8, 2010, which claims the benefit of Japanese Patent Application No. 2009-258444, filed Nov. 11, 2009, which are incorporated by reference in their entireties.

TECHNICAL FIELD

The present invention relates to a slurry for chemical mechanical polishing, which is preferable for the production of a semiconductor substrate, and a polishing method for substrate using the slurry.

BACKGROUND ART

A semiconductor circuit is made to show a high performance by high densification achieved by miniaturization of transistor, resistance, wiring and the like constituting a circuit, as well as high-speed responses. In addition, lamination of wirings has enabled higher densification and higher integration of semiconductor circuits. The semiconductor production techniques that have enabled the above include shallow trench isolation, metal plug and damascene process. The "shallow trench isolation" means transistor element isolation, the "metal plug" means three-dimensional wiring using a metal having a structure penetrating an interlayer dielectric film, and the "damascene process" means an embedding technique of copper wiring. The technique essential for each step such as shallow trench isolation and the like is chemical mechanical polishing. The chemical mechanical polishing (hereinafter sometimes to be abbreviated as "CMP") is constantly used for each step of shallow trench isolation, damascene process, interlayer dielectric formation and metal plug embedding. These fine patterns are formed by transcription of a resist mask formed by a photolithography step. As miniaturization proceeds, the depth of the focus of the projector lens used for the lithography becomes shallow, and the required level of flatness of the worked surface of a substrate becomes high, since the concaves and convexes on the substrate needs to be smaller than the depth. By planarizing the worked surface by CMP, a flat surface of a nano order or atom level can be obtained, and high performance by three-dimensional wiring, i.e., lamination, becomes possible. CMP is currently introduced for planarization of an interlayer dielectric film, formation of BPSG film (silicon oxide film doped with boron, phosphorus and the like) or shallow trench isolation region, formation of plug and embedding metal wiring and the like.

For formation of a shallow trench isolation region, CMP is used for removing a redundant insulating film made from silicon oxide etc. formed on a substrate, and a stopper film is formed beneath the aforementioned insulating film to stop polishing. As a stopper film, silicon nitride and the like are generally used, and the polishing end point can be easily determined by increasing the polishing rate ratio of the aforementioned insulating film and the stopper film. It is desirable to obtain a flat polished film by polishing to eliminate the difference between the levels of the insulating film and stopper film. To obtain a flat polished film, it is further desirable that the polishing should stop on the stopper film even when polished excessively and polishing of the insulating film and stopper film should not proceed.

Conventionally, it is known that a water-soluble organic compound such as polyacrylic acid, a salt thereof and the like is added to a slurry for CMP in an attempt to improve stability of abrasive grain in the slurry for CMP, control polishing rate, improve flatness, reduce difference in level, and suppress increase of difference in level due to excess polishing (see patent document 1 and patent document 2).

In addition, a system using a carboxylic acid polymer such as polyacrylic acid, a salt thereof and the like, and polyvinylpyrrolidone, a cationic compound and an amphoteric ion compound in combination is also known (see patent document 3).

On the other hand, a slurry for CMP comprised of at least one kind of water-soluble polymer selected from the group consisting of a polyacrylic acid having a weight average molecular weight of not less than 1 million and not more than 10 million and a salt thereof, β-cyclodextrin and colloidal silica is known (see patent document 4).

DOCUMENT LIST

Patent Documents patent document 1: JP-B-3672493
patent document 2: JP-B-3649279
patent document 3: JP-A-2007-273973
patent document 4: JP-A-2009-158810

SUMMARY OF THE INVENTION

Problems to be Solved by the Invention

A shallow trench isolation region can be generally formed by the following steps.

FIG. 1-FIG. 5 are schematic sectional views stepwisely showing formation steps of a shallow trench isolation region in a production process of a semiconductor device. FIGS. 1-5 show that one part of a semiconductor device is formed in a substrate (wafer). In fact, plural semiconductor devices having a shallow trench isolation region are prepared for one substrate, and separated into individual semiconductor devices (chips) by dicing. In addition, the size of each part in the drawings was set to facilitate understanding and the size ratio between each part and each part does not necessarily match the actual ratio.

Figure 1:
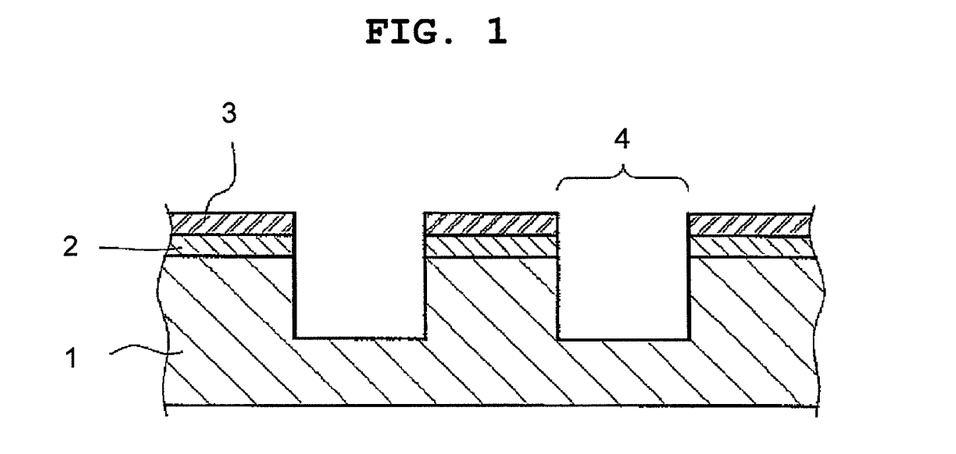
FIG. 1 is a schematic sectional view of a substrate having a trench formed by etching.
Figure 2:
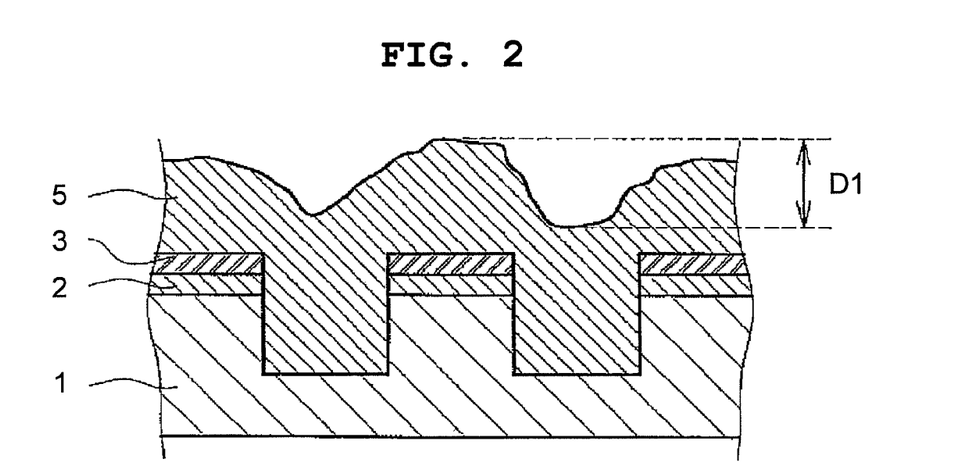
FIG. 2 is a schematic sectional view of a substrate having an insulating film laminated by CVD.
Figure 3:
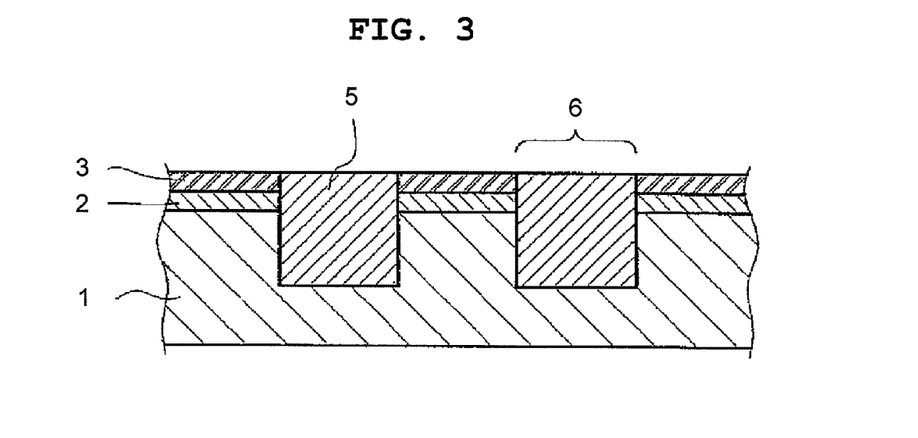
FIG. 3 is a schematic sectional view of a substrate having an insulating film polished by ideal CMP.

First, a stopper film 3 is laminated on an oxidized insulating film 2 (silicon oxide and the like) on the surface of substrate 1. Then, a resist film (not shown) is laminated by photolithography on the substrate 1 on which oxidized insulating film 2 and stopper film 3 are laminated and, after etching, the resist film is removed to form a trench 4 (etched part) (FIG. 1). An insulating film 5 (silicon oxide and the like) is laminated by CVD and the like to fill the trench 4 (FIG. 2). In CMP of substrate 1 on which the insulating film 5 is laminated, it is ideal to flatly polish stopper film 3 and insulating film 5 to form a flat shallow trench isolation region 6 (FIG. 3).

Figure 4:
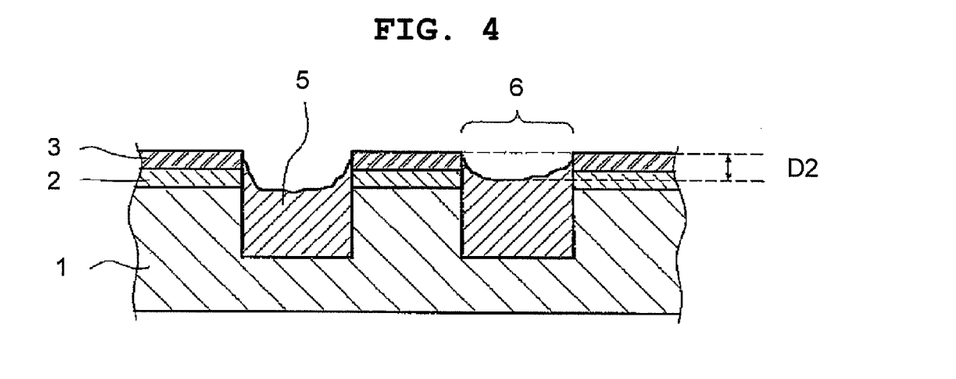
FIG. 4 is a schematic sectional view of a substrate having an insulating film polished by actual CMP.

However, since the part of stopper film 3 and the part of trench 4 are different in height (FIG. 1), an insulating film 5 having an initial level difference D1 is formed by CVD and the like (FIG. 2). Thus, a level difference D2 is problematically formed by subsequent CMP between the stopper film 3 and the insulating film 5 (FIG. 4).

Figure 5:
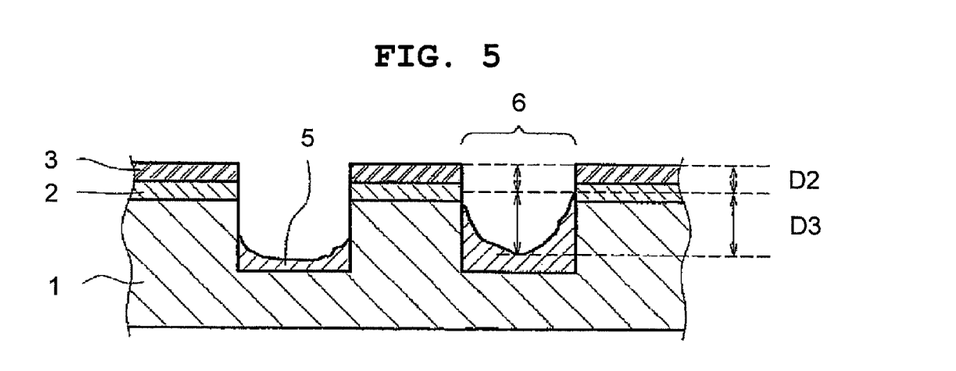
FIG. 5 is a schematic sectional view of a substrate polished excessively.

Moreover, since a substrate has waviness, it is actually difficult to uniformly polish the whole substrate. When a substrate is polished to completely expose the entirety of the stopper film 3 thereon, a problem occurs in that insulating film 5 filled in trench 4 is further polished (excess polishing) in a part of the stopper film 3 which is exposed in an early stage. In the excessively polished part, the level difference further grows (FIG. 5). In FIG. 5, D3 shows an amount of increase in level difference caused by excessive polishing.

A slurry for CMP containing a water-soluble organic compound such as polyacrylic acid, a salt thereof and the like, which is described in patent documents 1-3, and a slurry for CMP further containing polyvinylpyrrolidone and the like in combination are not necessarily satisfactory to minimize difference between levels of an insulating film and a stopper film. Moreover, in a slurry for CMP described in patent document 4, no suggestion is given as to minimization of difference between levels of an insulating film and a stopper film and, as far as the present inventors have confirmed, these slurries for CMP cannot minimize difference between levels of an insulating film and a stopper film.

Accordingly, the present invention aims to provide a slurry for CMP, which is superior in the planarization property of a polished film, and does not damage a polished film, particularly, a slurry for CMP, which can provide an extremely small difference between the levels of an insulating film formed from silicon oxide etc. and a stopper film formed from silicon nitride etc., in a shallow trench isolation region formation step, and a polishing method of a substrate.

Means of Solving the Problems

The present inventors have conducted intensive studies in an attempt to solve the above-mentioned problem and found that the planarization property of a polished film is improved by using, as a slurry for CMP, a composition containing a polishing abrasive grain (c), as well as a water-soluble clathrate compound (a) and a polymer compound (b) having an acidic group optionally in a salt form as a side chain and a specific molecular weight in specific amounts and, particularly, a polished film having an extremely small difference between the levels of an insulating film and a stopper film can be obtained in a shallow trench isolation region formation step.

In the present invention (i.e., the present specification and claims), "polymer compound (b) having an acidic group as a side chain" means that "polymer compound (b) has an acidic group as a pendant group".

Accordingly, the present invention relates to [1]-[12] below.

[1] A slurry for chemical mechanical polishing comprising water-soluble clathrate compound (a), polymer compound (b) having an acidic group optionally in a salt form as a side chain, polishing abrasive grain (c) and water (d), wherein
the content of the water-soluble clathrate compound (a) is 0.001 mass %-3 mass % of the total amount of the slurry,
the polymer compound (b) has a weight average molecular weight of not less than 1,000 and less than 1,000,000,
the content of the polymer compound (b) is 0.12 mass %-3 mass % of the total amount of the slurry.
[2] The slurry of the above-mentioned [1], wherein the water-soluble clathrate compound (a) has a weight average molecular weight of 200-1,000,000.
[3] The slurry of the above-mentioned [1] or [2], wherein the water-soluble clathrate compound (a) is one or more kinds selected from the group consisting of cyclic oligosaccharide and a derivative thereof.
[4] The slurry of the above-mentioned [3], wherein the cyclic oligosaccharide and a derivative thereof are α-cyclodextrin, β-cyclodextrin, γ-cyclodextrin, and derivatives of these.
[5] The slurry of any one of the above-mentioned [1]-[4], wherein the polymer compound (b) has a carboxy group optionally in a salt form.
[6] The slurry of the above-mentioned [5], wherein the polymer compound (b) comprises polymer (b-1) comprising (meth)acrylic acid and/or a salt thereof in a unit amount of not less than 25 mass % in the polymer.
[7] The slurry of the above-mentioned [6], wherein the polymer compound (b) is one or more kinds selected from the group consisting of polyacrylic acid, a salt of polyacrylic acid with ammonium, a salt of polyacrylic acid with amine, polymethacrylic acid, a salt of polymethacrylic acid with ammonium and a salt of polymethacrylic acid with amine.
[8] The slurry of any one of the above-mentioned [1]-[7], wherein the polishing abrasive grain (c) is an inorganic oxide particle having an average particle size of 0.5 nm-1,000 nm.
[9] The slurry of the above-mentioned [8], wherein the inorganic oxide particles are one or more kinds of particles selected from the group consisting of aluminum oxide, cerium oxide, fumed silica, colloidal silica, zirconium oxide, titanium oxide, tin oxide, germanium oxide, magnesium oxide and manganese oxide.
[10] The slurry of any one of the above-mentioned [1]-[9], which has pH 3-12.5.
[11] A method of polishing a substrate comprising relatively moving a substrate and a polishing pad while supplying the slurry for chemical mechanical polishing of any one of the above-mentioned [1]-[10] between the substrate and the polishing pad to polish a film to be polished on the substrate.
[12] The method of the above-mentioned [11], wherein the film to be polished on the substrate is a silicon oxide film and/or a silicon nitride film.

Effect of the Invention

The slurry for CMP of the present invention is superior in the planarization property of the polished film on the substrate, can particularly afford a polished film having an extremely small difference between the levels of the insulating film and the stopper film by polishing an insulating film or an interlayer dielectric in the formation of a shallow trench isolation region, and can improve the yield of substrate production.

DESCRIPTION OF EMBODIMENTS

The slurry for CMP of the present invention contains a water-soluble clathrate compound (a), a polymer compound (b) having an acidic group optionally in a salt form as a side chain, a polishing abrasive grain (c) and water (d). The component contained in the slurry for CMP of the present invention may be one kind only or a combination of two or more kinds thereof.

In the present invention, as the "water-soluble clathrate compound", a compound having solubility in water at 25° C. of not less than 0.01 g/L is preferable. When the solubility in water at 25° C. is less than 0.01 g/L, the effects of reduction of the difference between the levels of the insulating film and the stopper film and suppression of increased level difference due to excessive polishing cannot be achieved. To well reduce the aforementioned level difference and increased level difference due to excessive polishing by adding to a slurry for polishing, the solubility in water at 25° C. is preferably not less than 0.1 g/L, more preferably not less than 0.5 g/L.

The "clathrate compound" is a molecule having a cavity, and a generic term of compounds capable of incorporating other molecules (guest) in molecules thereof (host). As the host compound, tubular or cyclic compounds such as cyclodextrin, crown ether and the like are well known. These compounds are known to be able to control the size of the guest molecule to be incorporated by the size of the cavity. As the clathrate compound, a cyclic compound is preferable.

Examples of the aforementioned water-soluble clathrate compound (a) include cyclic oligosaccharide and a derivative thereof, water-soluble porphyrin, water-soluble phthalocyanine, crown ether, water-soluble cyclophane, water-soluble calixarene and the like. In addition, a polymer containing the aforementioned cyclic oligosaccharide or a derivative thereof or the like as a unit can also be used as a water-soluble clathrate compound (a). As the water-soluble clathrate compound (a), cyclic oligosaccharide or a derivative thereof is preferable from the aspects of industrial availability and the like.

One kind of the aforementioned cyclic oligosaccharide and a derivative thereof may be selected and used alone, or two or more kinds thereof may be selected and used in combination.

In the present invention, as the "cyclic oligosaccharide and a derivative thereof", a compound wherein 5-20 monosaccharides are cyclized, irrespective of the binding positions, and a derivative thereof can be mentioned.

Monosaccharides having a pyranose skeleton and/or a furanose skeleton can be used irrespective of the stereoisomer in D-form or L-form. Examples of the monosaccharide include allose, talose, gulose, glucose, altrose, mannose, galactose, idose, rhamnose, erythrose, threose, ribose, lyxose, xylose, arabinose and the like.

Preferable examples of the cyclic oligosaccharide and a derivative thereof include cyclodextrin, cyclomannin, cycloawaodorin, isocyclomaltopentaose, isocyclomaltohexaose and derivatives thereof. α-Cyclodextrin, β-cyclodextrin, γ-cyclodextrin, and derivatives thereof are preferable from the aspects of industrial availability and the like, and α-cyclodextrin and a derivative thereof, a derivative of β-cyclodextrin, and γ-cyclodextrin and a derivative thereof are more preferable from the aspects of water-solubility.

Examples of the aforementioned derivative of cyclic oligosaccharide include, (a) an alkoxylated derivative wherein the hydrogen atom of the hydroxy group of cyclic oligosaccharide is substituted by a linear or branched chain alkyl group having a carbon number of 1-20, such as methyl, ethyl, propyl, isopropyl, butyl, isobutyl, pentyl, hexyl, heptyl, octyl, 2-ethylhexyl, nonyl, decyl and the like, (b) an esterified derivative obtained by reacting hydroxy group of cyclic oligosaccharide with the carboxy group of carboxylic acid (e.g., monocarboxylic acid such as formic acid, acetic acid, propionic acid, butyric acid, valeric acid, caproic acid, enanthic acid, caprylic acid, pelargric acid, capric acid and the like; dicarboxylic acid such as oxalic acid, malonic acid, succinic acid, fumaric acid, glutaric acid, adipic acid, pimelic acid, suberic acid, azelaic acid, sebacic acid, phthalic acid, isophthalic acid, terephthalic acid and the like; hydroxycarboxylic acid such as tartaric acid, citric acid, isocitric acid and the like), and the like.

The aforementioned water-soluble clathrate compound (a) needs to be contained in a proportion of 0.001 mass %-3 mass % of the total amount of the slurry. When the content of the aforementioned water-soluble clathrate compound (a) is less than 0.001 mass % of the total amount of the slurry, the difference between the levels of the insulating film and the stopper film cannot be reduced, and the amount of increase in level difference due to excessive polishing increases. On the other hand, when the content of the aforementioned water-soluble clathrate compound (a) exceed 3 mass % of the total amount of the slurry, the polishing abrasive grain (c) tends to coagulate in the slurry for CMP. To suppress coagulation of the polishing abrasive grain (c) in the slurry for CMP, the content of the water-soluble clathrate compound (a) is more preferably 0.01 mass %-2.5 mass %, further preferably 0.05 mass %-2 mass %, of the total amount of the slurry.

The aforementioned water-soluble clathrate compound (a) preferably has a weight average molecular weight of 200-1,000,000. When the aforementioned molecular weight is less than 200, the difference between the levels of the insulating film and the stopper film cannot be reduced, and when it exceeds 1,000,000, the viscosity of the slurry for CMP increases and the inflow property of the slurry for CMP decreases during polishing, thus sometimes resulting in low polishing uniformity. The weight average molecular weight of water-soluble clathrate compound (a) is more preferably 500-400,000, further preferably 700-50,000, to provide good action and effect as a slurry for CMP, from the aspects of reduction of difference between the levels of the insulating film and the stopper film and polishing uniformity. The aforementioned weight average molecular weight is a value obtained by connecting GPC column ("GMPWXL" manufactured by Tosoh Corporation) with a GPC apparatus ("150C" manufactured by Waters), measuring by using 200 mM aqueous phosphate solution as a mobile phase, converting the value based on the polyethylene glycol standard.

The aforementioned polymer compound (b) needs to have a weight average molecular weight of not less than 1,000 and less than 1,000,000. When the weight average molecular weight of the aforementioned polymer compound (b) is less than 1,000, the difference between the levels of the insulating film and the stopper film can not be reduced, and the amount of increase in level difference due to excessive polishing increases. When the weight average molecular weight of the aforementioned polymer compound (b) is not less than 1,000,000, the polishing rate and polishing uniformity decrease. The weight average molecular weight of the aforementioned polymer compound (b) is more preferably 2,000-700,000, further preferably 3,000-400,000, from the aspects of polishing rate and polishing uniformity. The weight average molecular weight is a value obtained by connecting GPC column ("GMPWXL" manufactured by Tosoh Corporation) with a GPC apparatus ("150C" manufactured by Waters), measuring by using 200 mM aqueous phosphate solution as a mobile phase, converting the value based on the polyethylene glycol standard.

The aforementioned polymer compound (b) needs to be contained in a proportion of 0.12 mass %-3 mass % of the total amount of the slurry. When the content of the aforementioned polymer compound (b) is less than 0.12 mass % of the total amount of the slurry, the difference between the levels of the insulating film and the stopper film cannot be reduced, and the amount of increase in level difference due to excessive polishing increases. On the other hand, when the content of the aforementioned polymer compound (b) exceed 3 mass % of the total amount of the slurry, the polishing abrasive grain (c) tends to coagulate in the slurry for CMP.

To reduce the difference between the levels of the insulating film and the stopper film, suppress increased level difference due to excessive polishing and suppress coagulation of the polishing abrasive grain (c) in the slurry for CMP, the content of the aforementioned polymer compound (b) is more preferably 0.14 mass %-1 mass %, further preferably 0.16 mass %-0.8 mass %, of the total amount of the slurry.

Examples of the acidic group of the aforementioned polymer compound (b) include a phosphono group (—P(O)(OH)$_2$, also referred to as a "phosphoric acid group"), a sulfo group (—SO$_3$H, also referred to as a "sulfonic acid group"), a carboxy group (—COOH) and the like. The acidic group may be in a salt form. Since interaction with the water-soluble clathrate compound (a) is superior, the aforementioned polymer compound (b) is preferably one having a carboxy group optionally in a salt form as a side chain.

Examples of the salt of the acidic group that the aforementioned polymer compound (b) has as a side chain include alkali metal salts such as sodium salt, potassium salt, lithium salt and the like; alkaline earth metal salts such as magnesium salt, calcium salt and the like; amine salt; and ammonium salt. To suppress metal contamination in a is semiconductor production step, amine salt and ammonium salt are preferable. As an amine to form the aforementioned amine salt, primary amine, secondary amine and tertiary amine can be used, and more specifically, methylamine, dimethylamine, trimethylamine, ethylamine, diethylamine, triethylamine, n-butylamine, di-n-butylamine, tri-n-butylamine, isopropylamine and the like can be mentioned.

The aforementioned polymer compound (b) preferably contains polymer (b-1) wherein the unit amount of (meth) acrylic acid and/or a salt thereof (hereinafter sometimes abbreviated as "(meth)acrylic acid (salt)") in the polymer is not less than 25 mass %, and the aforementioned polymer compound (b) is more preferably the aforementioned polymer (b-1). The polymer (b-1) wherein the unit amount of (meth)acrylic acid (salt) is not less than 25 mass % can show a good interaction with the aforementioned water-soluble clathrate compound (a). The unit amount of (meth)acrylic acid (salt) in the polymer (b-1) is preferably not less than 50 mass %, more preferably not less than 75 mass %, further preferably not less than 85 mass %, most preferably 100 mass %. The polymer compound (b) is preferably one or more kinds selected from the group consisting of them.

The aforementioned polymer (b-1) can contain a unit other than (meth)acrylic acid (salt) (abbreviated as "other unit") in an amount of 75 mass % or below of the polymer. As other unit, those derived from a monomer having an unsaturated double bond can be mentioned. Examples of the aforementioned monomer having the unsaturated double bond include vinyl acetate, carboxylic acids such as itaconic acid, fumaric acid, maleic acid and the like and the salts thereof; acrylic esters such as methyl acrylate, ethyl acrylate, propyl acrylate, butyl acrylate, pentyl acrylate, hexyl acrylate, heptyl acrylate, octyl acrylate and the like; methacrylic esters such as methyl methacrylate, ethyl methacrylate, propyl methacrylate, butyl methacrylate, pentyl methacrylate, hexyl methacrylate, heptyl methacrylate, octyl methacrylate, 2-hydroxyethyl methacrylate and the like; sulfonic acids such as vinyl sulfonic acid, styrene sulfonic acid and the like and the salts thereof, vinyl compound such as acrylonitrile, vinylpyrrolidone and the like; (meth)acrylamides such as acrylamide, methacrylamide, N,N-dimethylacrylamide, N,N-diethylacrylamide and the like; and the like.

The aforementioned polymer compound (b) is preferably a polymer consisting of (meth)acrylic acid and/or a salt thereof alone. In the production of such polymer, an arbitrarily proportion of one or more kinds selected from (meth) acrylic acid and the salts thereof can be polymerized.

The aforementioned polymer compound (b) is preferably one or more kinds selected from the group consisting of polyacrylic acid, salt of polyacrylic acid with ammonium, salt of polyacrylic acid with amine, polymethacrylic acid, salt of polymethacrylic acid with ammonium and salt of polymethacrylic acid with amine, more preferably one or more kinds selected from the group consisting of salt of polyacrylic acid with ammonium and salt of polyacrylic acid with amine.

The aforementioned polishing abrasive grain (c) is preferably fine particles having an average particle size of 0.5 nm-1,000 nm. When the average particle size of the aforementioned polishing abrasive grain (c) is less than 0.5 nm, the polishing rate may decrease, and when the average particle size exceeds 1,000 nm, the polishing flaw tends to develop. To prevent decrease of the polishing rate and the development of a polishing flaw, the average particle size of the aforementioned polishing abrasive grain (c) is more preferably 1 nm-700 nm, further preferably 5 nm-500 nm.

The average particle size of the aforementioned polishing abrasive grain (c) can be measured by dynamic light scattering by using a particle size measuring apparatus ("Zeta-potential & Particle-size Analyzer ELSZ-2" manufactured by Otsuka Electronics Co., Ltd. etc.).

As the aforementioned polishing abrasive grain (c), an organic compound, a polymer compound, an inorganic compound and an organic-inorganic composite material can be used.

While the aforementioned organic compound and polymer compound are not particularly limited, for example, a fullerene derivative, and polymer compound particles obtained by polymerizing one or a combination of plural monomers having an unsaturated double bond, such as polystyrene particles, polyethylene particles, polyacrylic acid particles, polymethacrylic acid particles, polyacrylamide particles, polymethacrylamide particles and the like, and the like can be mentioned.

Examples of the aforementioned inorganic compound include compounds such as fullerene, nanodiamond, silicon, germanium, silicon oxide, germanium oxide, metal, metal compound (e.g., metal oxide, metal sulfide, metal chloride, metal carbonate, metal sulfate, metal nitrate, metal fluoride, metal bromide, metal nitride, metal iodide), gallium arsenide, zinc selenide, cadmium tellurium and the like. As the metal of the aforementioned metal and metal compound, lithium, sodium, potassium, magnesium, calcium, aluminum, gallium, indium, zinc, cadmium, copper, silver, gold, nickel, palladium, cobalt, rhodium, iron, manganese, chrome, molybdenum, tungsten, vanadium, niobium, tantalum, titanium, cerium, lanthanum, yttrium, iridium, zirconium, tin and the like can be mentioned. They can be used alone or a combination of plural kinds thereof.

Examples of the aforementioned organic-inorganic composite material include inorganic compound particles coated with an organic compound, organic compound particles coated with an inorganic compound, inorganic compound particles dispersed in organic compound particles, organic polysiloxane compound and the like.

From the aspect of polishing efficiency, the aforementioned inorganic compound particles are preferably used as the polishing abrasive grain (c). Respective particles of aluminum oxide, cerium oxide, fumed silica, colloidal silica, zirconium oxide, titanium oxide, tin oxide, germanium oxide, magnesium oxide and manganese oxide are more preferable, and cerium oxide particles are more preferable, from among the aforementioned inorganic compound particles, since they have a high polishing rate and are superior in the reduction of polishing flaws.

The content of the polishing abrasive grain (c) is preferably 0.1 mass %-30 mass %, more preferably 0.2 mass %-25 mass %, particularly preferably 0.3 mass %-20 mass %, of the total amount of the slurry. When the aforementioned content is less than 0.1 mass %, the polishing rate tends to decrease, and when it exceeds 30 mass %, the polishing abrasive grain tends to coagulate. From the aspects of the polishing rate and suppression of the polishing flaw, the content of the aforementioned polishing abrasive grain (c) is most preferably 0.5 mass %-15 mass %.

As long as the effect of the present invention is not inhibited, the slurry for CMP of the present invention can contain a known dispersant to improve the dispersion stability of a polishing abrasive grain.

Examples of the aforementioned dispersant include water-soluble anionic dispersant, water-soluble nonionic dispersant, water-soluble cationic dispersant, water-soluble ampholytic dispersant and the like. Examples of the aforementioned water-soluble anionic dispersant include polyacrylic acid, polymethacrylic acid, polystyrene sulfonic acid, polysulfonic acid etc., and the salts thereof, which do not fall under the aforementioned polymer compound (b). Examples of the aforementioned water-soluble nonionic dispersant include polyvinyl alcohol, polyvinyl butyral, polyethylene glycol, polyvinylpyrrolidone, polyacrylamide, polymethacrylamide, N-substituted polyacrylamide, N,N-substituted polyacrylamide and the like, and examples of the water-soluble cationic dispersant include polyethyleneimine, polyallylamine and the like. Examples of the aforementioned water-soluble ampholytic dispersant include a copolymer obtained by polymerizing a cationic monomer having an unsaturated double bond and an anionic monomer having an unsaturated double bond, betaine having an anion and a cation on each terminal and the like. In the present invention, one or more kinds of dispersants selected from those can be used.

The slurry for CMP of the present invention may contain an anionic polymer compound, a nonionic polymer compound, a cationic polymer compound, an ampholytic polymer compound and polysaccharides as long as the effect of the present invention is not inhibited. As the aforementioned anionic polymer compound, polyacrylic acid, polymethacrylic acid, polystyrene sulfonic acid, polysulfonic acid etc., and salts thereof and the like, which do not fall under the aforementioned polymer compound (b) can be mentioned and, as the aforementioned nonionic polymer compound, polyvinyl alcohol, polyvinyl butyral, polyethylene glycol, polyvinylpyrrolidone, polyacrylamide, polymethacrylamide, N-substituted polyacrylamide, N,N-substituted polyacrylamide, polyoxyethylenelauryl ether, polyoxyethylenecetyl ether, polyoxyethylenestearyl ether, polyoxyethyleneoleyl ether and the like can be mentioned. As the aforementioned cationic polymer compound, polyethyleneimine, polyallylamine and the like can be mentioned and, as the aforementioned ampholytic polymer compound, a copolymer obtained by polymerizing a cationic monomer having an unsaturated double bond and an anionic monomer having an unsaturated double bond and the like can be mentioned. Examples of the aforementioned polysaccharides include dextran, glycogen, amylose, amylopectin, heparin, agarose and the like.

Furthermore, the slurry for CMP of the present invention may contain a low-molecular-weight compound having a molecular weight of 10-1,000 as long as the effect of the present invention is not inhibited. Examples of the low-molecular-weight compound include amines such as ethylamine, diethylamine, triethylamine, pyridine, piperazine, imidazole, butylamine, dibutylamine, isopropylamine, N,N-dimethylethanolamine, N,N-diethylethanolamine, aminoethylethanolamine and the like; alcohols such as methanol, ethanol, 1-propanol, 2-propanol, ethylene glycol and the like; carboxylic acids such as formic acid, acetic acid, butyric acid, propionic acid, malonic acid, succinic acid, fumaric acid, maleic acid, phthalic acid, salicylic acid, acrylic acid, methacrylic acid and the like; amino acids such as glycine, alanine, phenylalanine, glutamic acid, aspartic acid, histidine and the like; ethers such as dioxane, dimethyl ether, diethyl ether, methylethyl ether and the like; ketones such as acetone, diethyl ketone, methyl ethyl ketone and the like; oxidants such as hydrogen peroxide, ammonium persulfate and the like; complexing agents such as benzotriazole, thiabendazole and the like; and the like.

In the slurry for CMP of the present invention, a composite of the aforementioned water-soluble clathrate compound (a) and the aforementioned polymer compound (b) can be formed by using them in combination. The aforementioned composite has high adsorptivity to a substrate, and can effectively form an adsorption film on a substrate. During polishing, the adsorption film shows an improved protective action on the concave part of the substrate as compared to the use of polymer compound (b) alone, and therefore, only the convex part is effectively polished. As a result, the slurry for CMP of the present invention is considered to achieve good planarization property. As compared to the prior art that uses one or more kinds of water-soluble polymer compounds (e.g., polyacrylic acid etc.) alone, the convex part can be selectively polished and good reduction of the level difference can be achieved by using the slurry for CMP of the present invention containing both the aforementioned water-soluble clathrate compound (a) and the aforementioned polymer compound (b).

In the present invention, water (d) is not particularly limited, and distilled water, deionized water and the like can be preferably used. The content of water (d) is the amount obtained by subtracting the content of essential components (water-soluble clathrate compound (a), polymer compound (b), and polishing abrasive grain (c)), and optional component (for example, dispersant) from the slurry for CMP.

The slurry for CMP of the present invention is preferably adjusted to a desired pH and used for polishing. As the pH adjuster, an acid or a base can be used. As the acid, hydrochloric acid and the like can be mentioned. When a base is used, aqueous ammonia or organic amine is preferably used rather than alkali metal hydroxide, thereby to prevent metal contamination in semiconductor polishing.

The slurry for CMP of the present invention preferably has pH 3-12.5. When the pH of the slurry for CMP is less than 3, the polishing rate decreases, and when it exceeds 12.5, the flatness of the insulating film on a substrate tends to decrease. In view of the polishing rate and the flatness of the insulating film on a substrate, the pH of the slurry for CMP of the present invention is more preferably 3.3-12, further preferably 3.5-11.7.

In the present invention, the pH of a slurry for CMP can be measured, for example, by a pH meter ("pH meter F22" manufactured by Horiba, Ltd., etc.) according to a conventional method.

The slurry for CMP of the present invention can be prepared, for example, as a three-liquid type slurry for CMP consisting of an aqueous solution of a water-soluble clathrate compound (a), an aqueous solution of a polymer compound (b), and a slurry of polishing abrasive grain (c). In addition, it can also be prepared as a two-liquid type slurry for CMP consisting of a slurry containing polished abrasive grain (c) or a slurry obtained by mixing aqueous solution of water-soluble clathrate compound (a) and polishing abrasive grain (c), and an aqueous mixed solution water-soluble clathrate compound (a) and polymer compound (b); a two-liquid type slurry for CMP consisting of a slurry of a mixture of polishing abrasive grain (c) and water-soluble clathrate compound (a), and an aqueous solution of polymer compound (b); or a two-liquid type slurry for CMP consisting of a slurry of a mixture of polishing abrasive grain (c) and polymer compound (b), and an aqueous solution of water-soluble clathrate compound (a). Alternatively, it can also be prepared as a one-liquid type slurry for CMP consisting of an aqueous solution of a mixture of water-soluble clathrate compound (a), polymer compound (b) and polishing abrasive grain (c). In the present invention, when it is prepared as the aforementioned two-liquid type or three-liquid type slurry, they are mixed into a one-liquid type slurry when polishing.

In the aforementioned two-liquid type or three-liquid type slurry for CMP, the formulation of each component can be freely changed when in use, and therefore, the planarization property, polishing rate and level difference elimination property can be easily controlled. For polishing using a two-liquid type slurry for polishing or three-liquid type slurry for polishing, for example, a method including feeding a slurry containing polishing abrasive grain (c), and an aqueous mixed solution of water-soluble clathrate compound, (a) and polymer compound (b) through separate pipings, joining these pipings to mix them immediately before the outlet of the supply piping and supplying the mixture on a polishing pad, a method including mixing a slurry containing polishing abrasive grain (c), with an aqueous mixed solution of water-soluble clathrate compound (a) and polymer compound (b) immediately before polishing and the like are employed. Moreover, when polishing is performed with a two-liquid type or three-liquid type slurry for polishing, the polishing property can also be controlled as mentioned above by mixing each slurry with water as necessary immediately before polishing or mixing in a piping.

The polishing method of the present invention is characterized by pressing a substrate with a film formed thereon to be polished against a polishing pad adhered onto a polishing surface plate with a double sided tape, a hook-and-loop fastener and the like, applying a pressure thereon, and relatively moving the substrate and the polishing pad while supplying the slurry for CMP of the present invention between the substrate and the polishing pad to polish the film to be polished.

The polishing method of a substrate of the present invention is explained below by referring to a semiconductor substrate having a silicon oxide film, which is an inorganic insulating film, formed thereon.

In the polishing method of the present invention, as an apparatus used for polishing, a general polishing apparatus having a polishing surface plate to which a polishing pad can be attached, and equipped with a motor whose rotation number can be changed, and the like, and a holder capable of holding a substrate having a film to be polished and the like can be used.

While the polishing condition is not particularly limited, for efficiently polishing, a surface plate and a substrate each preferably show a low rotation number of 300 rpm or below, the pressure to be applied to a substrate is preferably not more than 150 kPa to prevent development of flaw after polishing. During polishing, it is preferable to continuously supply a slurry for CMP to a polishing pad by a pump etc. While the amount to be supplied is not limited, the surface of the polishing pad is preferably always covered with a slurry for CMP.

A semiconductor substrate after the completion of polishing is preferably washed well with running water, and dried by removing water drops attached to a semiconductor substrate by a spin dryer and the like. By polishing an inorganic insulating film, which is the film to be polished, with the aforementioned slurry for CMP in this way, the concaves and convexes on the insulating film surface can be reduced and a flat surface can be obtained over the whole surface of a semiconductor substrate. After forming a shallow trench isolation region planarized in this way, an aluminum wiring or copper wiring is formed on the inorganic insulating film, an inorganic insulating film is formed between and on the wirings by the below-mentioned method, and the film is similarly polished with a slurry for CMP to give a flat surface. This step is repeated a given number of times, whereby a semiconductor substrate having a desired number of layers can be produced.

While the polishing pad that can be used in the present invention is not particularly limited, for example, general non-woven fabric, woven fabric, artificial leather, synthetic resin and the like can be mentioned. Of these, a synthetic resin is preferably used.

Examples of the aforementioned synthetic resin include thermosetting polyurethane resin; thermoplastic polyurethane resin; epoxy resin; fluorine resin; polyolefin resins such as polyethylene resin, polypropylene resin and the like; crosslinked rubbers such as polybutadiene resin, polystyrene butadiene resin and the like; acrylic resins such as polyacrylic acid resin, polymethacrylic acid resin, polymethyl methacrylate resin and the like; vinyl resins such as polyvinyl alcohol resin, polyvinyl butyral resin, ethylene-vinyl acetate copolymer resin and the like; and the like. The aforementioned synthetic resins may be used alone, or plural kinds thereof may be used in combination, with addition of additives and the like. In view of abrasive resistance, a polyurethane resin is preferable.

While the aforementioned synthetic resin is not particularly limited, it may be a porous material. Examples of the production method of a porous material include a method of dispersing a fine hollow body in a synthetic resin, a method of forming, a substantially porous material by dispersing a water-soluble polymer compound alone or plural kinds thereof in combination in a synthetic resin to allow elution of the aforementioned water-soluble polymer compound by a slurry for CMP during polishing, a method using supercritical foam molding, a method of sintering fine particles of a polymer compound to form a continuous pore structure and the like.

The structure of the aforementioned polishing pad is not particularly limited, and it may be a single layer structure or a multi layer structure having a cushion layer. In addition, the aforementioned polishing pad is preferably processed to have a hole structure and/or a groove structure to pool a slurry for CMP. While the groove structure is not subject to any particular limitation, it may have a grid shape, a radial shape, a helicoid shape, a concentric shape or the like. The aforementioned groove structure and hole structure may be alone or plural kinds thereof may be used in combination. Furthermore, the aforementioned polishing pad may have a structure wherein an abrasive grain is contained in a polishing pad. To contain an abrasive grain in a polishing pad, for example, a method including mixing an abrasive grain, a synthetic resin and a solvent, injecting the mixture in a molding tool and drying same, or a method including mixing molten synthetic resin and an abrasive grain, injecting the mixture in a molding tool and cooling same can be used.

In the polishing method of the present invention, where necessary, a conditioner for CMP wherein diamond particles are fixed on the surface of a carrier by nickel electrodeposition and the like is attached to a polishing apparatus, the aforementioned conditioner is pressed against the polishing pad, and the surface of the aforementioned polishing pad can be controlled to have a surface roughness preferable for polishing an insulating film which is a film to be polished.

The slurry for CMP of the present invention can be applied not only to a silicon oxide film formed on a semiconductor substrate but also production processes of various semiconductor devices, MEMS (Micro Electro Mechanical Systems) and the like, and the like. For example, the slurry for CMP of the present invention can be used for polishing an inorganic insulating film such as silicon oxide film, glass film, silicon nitride film and the like, which is foLmed on a wiring board having a given wiring; a film mainly containing polysilicon, aluminum, copper, titanium, titanium nitride, tungsten, tantalum; tantalum nitride and the like; optical glass such as photomask, lens, prism and the like; an inorganic conductive film such as tin-doped indium oxide (ITO) and the like; optical monocrystal for an optical integrated circuit composed of glass and crystal materials, optical switching element, optical waveguide, end face of optical fiber, scintillator and the like; solid laser monocrystal; sapphire substrate for blue laser LED; semiconductor monocrystals such as silicon carbide, gallium phosphide, gallium arsenide and the like; glass substrate for magnetic disc; magnetic head and the like; synthetic resins such as methacryl resin, polycarbonate resin and the like; and the like.

The slurry for CMP of the present invention can be preferably used for polishing of, particularly, an insulating film in the formation of a shallow trench isolation region.

EXAMPLES

The present invention is explained in detail in the following by referring to Examples, which are not to be construed as limitative.

Example 1

Cerium oxide abrasive grain slurry (abrading agent "GPL-C1010" manufactured by Showa Denko K.K., content of cerium oxide abrasive grain in slurry 10 mass %, 50 g), α-cyclodextrin (manufactured by Wako Pure Chemical Industries, Ltd., 0.5 g), polyacrylic acid (manufactured by Wako Pure Chemical Industries, Ltd., weight average molecular weight 5,000, 2.5 g) and distilled water were mixed in a 1 L measuring cylinder. While stirring with a magnetic stirrer, 28 mass % aqueous ammonia (manufactured by Wako Pure Chemical Industries, Ltd.) was added to adjust the mixture to pH 5.0. Distilled water was added to the total amount of 1,000 g to give a slurry for CMP (abrasive grain content 0.5 mass %, α-cyclodextrin content 0.05 mass %, polyacrylic acid content 0.25 mass %).

Example 2

In the same manner as in Example 1 except that α-cyclodextrin (manufactured by Wako Pure Chemical Industries, Ltd., 1.5 g) (content 0.15 mass %) was used, a slurry for CMP was prepared.

Example 3

In the same manner as in Example 1 except that α-cyclodextrin (manufactured by Wako Pure Chemical Industries, Ltd., 3.0 g) (content 0.3 mass %) was used, a slurry for CMP was prepared.

Example 4

In the same manner as in Example 1 except that α-cyclodextrin (manufactured by Wako Pure Chemical Industries, Ltd., 3.0 g) (content 0.3 mass %) and polyacrylic acid (manufactured by Wako Pure Chemical Industries, Ltd., weight average molecular weight 25,000, 2.5 g) (content 0.25 mass %) as a polymer compound were used, a slurry for CMP was prepared.

Example 5

In the same manner as in Example 1 except that α-cyclodextrin (manufactured by Wako Pure Chemical Industries, Ltd., 3.0 g) (content 0.3 mass %) and polyacrylic acid (manufactured by Wako Pure Chemical Industries, Ltd., weight average molecular weight 250,000, 2.5 g) (content 0.25 mass %) as a polymer compound were used, a slurry for CMP was prepared.

Example 6

In the same manner as in Example 1 except that α-cyclodextrin (manufactured by Wako Pure Chemical Industries, Ltd., 3.0 g) (content 0.3 mass %) and polymethacrylic acid (manufactured by polyscience, weight average molecular weight 100,000, 2.5 g) (content 0.25 mass %) as a polymer compound were used, a slurry for CMP was prepared.

Example 7

In the same manner as in Example 1 except that β-cyclodextrin (manufactured by Wako Pure Chemical Industries, Ltd., 3.0 g) (content 0.3 mass %) was used as a water-soluble clathrate compound, a slurry for CMP was prepared.

Example 8

In the same manner as in Example 1 except that γ-cyclodextrin (manufactured by Wako Pure Chemical Industries, Ltd., 3.0 g) (content 0.3 mass %) was used as a water-soluble clathrate compound, a slurry for CMP was prepared.

Example 9

In the same manner as in Example 1 except that methyl-β-cyclodextrin (manufactured by Wako Pure Chemical Industries, Ltd., 4.5 g) (content 0.45 mass %) was used as a water-soluble clathrate compound, a slurry for CMP was prepared.

Example 10

In the same manner as in Example 1 except that 2-hydroxyethyl-β-cyclodextrin (manufactured by Wako Pure Chemical Industries, Ltd., 4.5 g) (content 0.45 mass %) was used as a water-soluble clathrate compound, a slurry for CMP was prepared.

Example 11

In the same manner as in Example 1 except that α-cyclodextrin (manufactured by Wako Pure Chemical Industries, Ltd., 1.5 g) (content 0.15 mass %), polyacrylic acid (manufactured by Wako Pure Chemical Industries, Ltd., weight average molecular weight 5,000, 1.5 g) (content 0.15 mass %) and cerium oxide abrasive grain slurry (the aforementioned GPL-C1010, 1.5 g) (content 0.15 mass %) were used, a slurry for CMP was prepared.

Comparative Example 1

In the same manner as in Example 1 except that α-cyclodextrin (manufactured by Wako Pure Chemical Industries, Ltd.) was not added, a slurry for CMP was prepared.

Comparative Example 2

In the same manner as in Example 1 except that α-cyclodextrin (manufactured by Wako Pure Chemical Industries, Ltd.) was not added, and polyacrylic acid (manufactured by Wako Pure Chemical Industries, Ltd., weight average molecular weight 25,000, 2.5 g) (content 0.25 mass %) was used as a polymer compound, a slurry for CMP was prepared.

Comparative Example 3

In the same manner as in Example 1 except that α-cyclodextrin (manufactured by Wako Pure Chemical Industries, Ltd.) was not added, and polyacrylic acid (manufactured by Wako Pure Chemical Industries, Ltd., weight average molecular weight 250,000, 2.5 g) (content 0.25 mass %) was used as a polymer compound, a slurry for CMP was prepared.

Comparative Example 4

In the same manner as in Example 1 except that α-cyclodextrin (manufactured by Wako Pure Chemical Industries, Ltd., 1.0 g) (content 0.1 mass %) and polyacrylic acid (manufactured by Wako Pure Chemical Industries, Ltd., weight average molecular weight 5,000, 1.0 g) (content 0.1 mass %) were used, a slurry for CMP was prepared.

Comparative Example 5

In the same manner as in Example 1 except that α-cyclodextrin (manufactured by Wako Pure Chemical Industries, Ltd., 1.0 g) (content 0.1 mass %) and polyacrylic acid (manufactured by Wako Pure Chemical Industries, Ltd., weight average molecular weight 250,000, 1.0 g) (content 0.1 mass %) as a polymer compound were used, a slurry for CMP was prepared.

Comparative Example 6

In the same manner as in Example 1 except that sucrose (manufactured by Wako Pure Chemical Industries, Ltd., 3.0 g) (content 0.3 mass %) was used instead of α-cyclodextrin, a slurry for CMP was prepared.

Comparative Example 7

In the same manner as in Example 1 except that dextran (manufactured by Wako Pure Chemical Industries, Ltd., 3.0 g) (content 0.3 mass %) was used instead of α-cyclodextrin, a slurry for CMP was prepared.

Comparative Example 8

In the same manner as in Example 3 except that polyacrylic acid was not added, a slurry for CMP was prepared.

Comparative Example 9

In the same manner as in Example 1 except that α-cyclodextrin (manufactured by Wako Pure Chemical Industries, Ltd., 3.0 g) (content 0.3 mass %) and polyacrylamide (manufactured by Wako Pure Chemical Industries, Ltd., weight average molecular weight 5,000, 2.5 g) (content 0.25 mass %) as a polymer compound were used, a slurry for CMP was prepared.

Comparative Example 10

In the same manner as in Example 7 except that polyacrylic acid (manufactured by KANTO CHEMICAL CO., INC., weight average molecular weight 1,080,000, 2.5 g) (content 0.25 mass %) was used as a polymer compound, a slurry for CMP was prepared.

The average particle size of the polishing abrasive grain (c) used for respective slurries for CMP of the aforementioned Examples and Comparative Examples was measured. In addition, pH of each slurry for CMP was measured. Using them, an insulating film was polished, and the difference between the levels of the insulating film and the stopper film was measured. The measurement method for the average particle size of polishing abrasive grain (c), the measurement method for slurry for CMP, and the measurement method for the difference between the levels of an insulating film and a stopper film are described below.

[Measurement of Average Particle Size of Polishing Abrasive Grain (c)]

Polishing abrasive grain (c) (the aforementioned GPL-C1010) was subjected to measurement twice by "Zeta-potential & Particle-size Analyzer ELSZ-2" manufactured by Otsuka Electronics Co., Ltd. under the conditions of 25° C., pinhole diameter 50 μm, solvent conditions; refractive index of water at 25° C.=1.33, viscosity=0.89 cP, dielectric constant=78.3. Average particle size and particle size distribution were determined by cumulant analysis, and an average of the two average particle sizes was taken as the average particle size of polishing abrasive grain (c). The average particle size was 197.1 nm.

[Measurement of pH]

Using "pH meter F22" manufactured by Horiba, Ltd. and a standard buffer (phthalate pH buffer; pH 4.00 (25° C.), neutral phosphate pH buffer; pH 7.00 (25° C.), borate pH buffer; pH 9.00 (25° C.)), three-point calibration was performed. The electrodes were placed in a slurry for CMP, and the stabilized value after lapse of 2 min or longer was measured.

[Polishing of Insulating Film]

As a test substrate, a patterned wafer "SKW3-2" manufactured by SKW was used. The aforementioned wafer includes, as shown in FIG. 2, oxidized insulating film 2 (silicon oxide), stopper film 3 (silicon nitride), trench 4 and insulating film 5 (silicon oxide) formed therein (thickness of oxidized insulating film 2: 10 nm, thickness of stopper film 3: 150 nm, width of stopper film 3: 100 μm, depth of trench 4 (distance from the surface of stopper film 3 to the bottom of trench 4): 500 nm, width of trench 4: 100 μm, average thickness of insulating film 5: 600 nm). The aforementioned wafer was fixed on a substrate-holding part of a polishing apparatus ("BC-15" manufactured by MAT). A 380 mmφ polishing pad ("IC1400" manufactured by Rohm & Haas, concentric circular groove) was adhered to a polishing surface plate with a double-sided tape. Using a conditioner (manufactured by A.L.M.T. Corp., diameter 19.0 cm), conditioning of the polishing pad was performed for 60 min while rotating in the same direction at pressure=3.48 kPa, rotation number of surface plate=100 rpm, rotation number of conditioner=140 rpm, and supplying pure water at a flow rate of 150 mL/min by a quantitative pump ("RP-1000" manufactured by TOKYO RIKAKIKAI CO, LTD).

Then, the polishing surface plate was rotated at 100 rpm, the aforementioned wafer was rotated at 99 rpm in the same direction while supplying each slurry for CMP of the Examples and Comparative Examples on the aforementioned polishing pad at a flow rate of 120 mL/min, and the aforementioned wafer was pressed against the aforementioned polishing pad at load of 23.4 kPa to polish the aforementioned wafer. The time point when the insulating film 5 (silicon oxide) on the stopper film 3 (silicon nitride) disappeared to expose the stopper film 3 was taken as a "just polishing", at which the polishing was stopped. The wafer was washed with distilled water and dried. Using an optical interference-type film thickness measuring apparatus ("Nano spec AFT Model 5100" manufactured by Nanometrics), the thickness of the stopper film 3 and the insulating film 5 was measured. The level difference D2 between the stopper film 3 and the insulating film 5 (FIG. 4) was measured using a surface-roughness measuring apparatus (small surface roughness measuring apparatus "SJ-400" manufactured by Mitutoyo Corporation) under setting of standard stylus, measuring range=80 μm, JIS2001, GAUSS filter, cutoff value λc=2.5 mm, cutoff value λs=8.0 μm, and the level difference D2 was calculated from the sectional curve.

In addition, the wafer after just polishing was further polished excessively as shown in FIG. 5, and the amount of increase in the level difference D3 was measured. To be specific, the wafer after just polishing was further polished for the time corresponding to 15% of the polishing time from the start of the polishing to the just polishing, and the film thickness and level difference were measured in the same manner as in the above.

The measurement results of pH, level difference D2 at just polishing, and the amount of increase in level difference D3 by excessive polishing, of each slurry for CMP of the Examples and Comparative Examples are shown in Table 1-Table 4.

TABLE 1

| | | Example | | | | | |
|---|---|---|---|---|---|---|---|
| | | 1 | 2 | 3 | 4 | 5 | 6 |
| water-soluble clathrate compound (a) | component | α-cyclodextrin | | | | | |
| | content (mass %) | 0.05 | 0.15 | 0.3 | 0.3 | 0.3 | 0.3 |
| polymer compound (b) | component | polyacrylic acid | | | | | polymethacrylic acid |
| | weight average molecular weight | 5000 | 5000 | 5000 | 25000 | 250000 | 100000 |
| | content (mass %) | 0.25 | 0.25 | 0.25 | 0.25 | 0.25 | 0.25 |
| polishing abrasive grain (c) | component | cerium oxide | | | | | |
| | content (mass %) | 0.5 | | | | | |
| pH | | 5.0 | 5.0 | 4.9 | 5.0 | 5.0 | 5.0 |
| polishing time (sec) | | 213 | 199 | 205 | 218 | 231 | 225 |
| just polishing | level difference D2 (nm) | 25 | 25 | 20 | 30 | 40 | 30 |
| 15%-over polishing | level difference (nm) | 39 | 31 | 23 | 36 | 46 | 40 |
| | amount of increase in level difference D3 (nm) | 14 | 6 | 3 | 6 | 6 | 10 |

TABLE 2

| | | Example | | | | |
|---|---|---|---|---|---|---|
| | | 7 | 8 | 9 | 10 | 11 |
| water-soluble clathrate compound (a) | component | β-cyclodextrin | γ-cyclodextrin | methyl-β-cyclodextrin | 2-hydroxyethyl-β-cyclodextrin | α-cyclodextrin |
| | content (mass %) | 0.3 | 0.3 | 0.45 | 0.45 | 0.15 |
| polymer compound (b) | component | polyacrylic acid | | | | |
| | weight average molecular weight | 5000 | | | | |
| | content (mass %) | 0.25 | 0.25 | 0.25 | 0.25 | 0.15 |
| polishing abrasive grain (c) | component | cerium oxide | | | | |
| | content (mass %) | 0.5 | 0.5 | 0.5 | 0.5 | 0.15 |

TABLE 2-continued

|  |  | Example | | | | |
|---|---|---|---|---|---|---|
|  |  | 7 | 8 | 9 | 10 | 11 |
| pH |  | 5.0 | 5.0 | 5.0 | 5.0 | 5.0 |
| polishing time (sec) |  | 249 | 176 | 238 | 195 | 260 |
| just polishing | level difference D2 (nm) | 35 | 20 | 40 | 30 | 35 |
| 15%-over polishing | level difference (nm) | 43 | 23 | 45 | 34 | 46 |
|  | amount of increase in level difference D3 (nm) | 8 | 3 | 5 | 4 | 11 |

TABLE 3

|  |  | Comparative Example | | | | |
|---|---|---|---|---|---|---|
|  |  | 1 | 2 | 3 | 4 | 5 |
| water-soluble clathrate compound (a) | component | — | — | — | α-cyclodextrin | α-cyclodextrin |
|  | content (mass %) | — | — | — | 0.1 | 0.1 |
| polymer compound (b) | component | polyacrylic acid | | | | |
|  | weight average molecular weight | 5000 | 25000 | 250000 | 5000 | 250000 |
|  | content (mass %) | 0.25 | 0.25 | 0.25 | 0.1 | 0.1 |
| polishing abrasive grain (c) | component | cerium oxide | | | | |
|  | content (mass %) | 0.5 | | | | |
| pH |  | 5.0 | 5.0 | 5.0 | 5.0 | 5.0 |
| polishing time (sec) |  | 158 | 162 | 163 | 178 | 172 |
| just polishing | level difference D2 (nm) | 65 | 60 | 65 | 65 | 70 |
| 15%-over polishing | level difference (nm) | 130 | 123 | 138 | 150 | 145 |
|  | amount of increase in level difference D3 (nm) | 65 | 63 | 73 | 85 | 75 |

TABLE 4

|  |  | Comparative Example | | | | |
|---|---|---|---|---|---|---|
|  |  | 6 | 7 | 8 | 9 | 10 |
| water-soluble (clathrate) compound (a) | component | sucrose | dextran | α-cyclodextrin | α-cyclodextrin | β-cyclodextrin |
|  | content (mass %) | 0.3 | 0.3 | 0.3 | 0.3 | 0.3 |
| polymer compound (b) | component | polyacrylic acid | polyacrylic acid | — | polyacrylamide | polyacrylic acid |
|  | weight average molecular weight | 5000 | 5000 | — | 5000 | 1080000 |
|  | content (mass %) | 0.25 | 0.25 | — | 0.25 | 0.25 |
| polishing abrasive grain (c) | component | cerium oxide | | | | |
|  | content (mass %) | 0.5 | | | | |
| pH |  | 5.0 | 5.0 | 5.0 | 5.0 | 5.0 |
| polishing time (sec) |  | 158 | 199 | 210 | 229 | 307 |
| just polishing | level difference D2 (nm) | 45 | 60 | 80 | 80 | 75 |
| 15%-over polishing | level difference (nm) | 97 | 107 | 129 | 146 | 143 |
|  | amount of increase in level difference D3 (nm) | 52 | 47 | 49 | 66 | 68 |

As clear from Table 1 and Table 2, when slurries for CMP of the Examples were used, the level difference D2 at just polishing was reduced, and the amount of increase in level difference D3 by excessive polishing was small. On the other hand, as shown in Table 3 and Table 4, when respective slurries of Comparative Examples 1-3 without containing a water-soluble clathrate compound, Comparative Examples 4 and 5 having a low content of polymer compound (b), Comparative Examples 6 and 7 containing a water-soluble compound which is not a clathrate compound, Comparative Example 8 without containing polymer compound (b), Comparative Example 9 containing a polymegr compound free of an acidic group instead of polymer compound (b) and Comparative Example 10 containing a polymer compound having a weight average molecular weight of 1,000,000 or more were used, the level difference D2 at just polishing was not reduced, and the amount of increase in level difference D3 by excessive polishing was high.

INDUSTRIAL APPLICABILITY

As described in detail in the above, the present invention provides a slurry for CMP applicable to silicon oxide film formed on a semiconductor substrate, and production processes of various semiconductor devices, and a polishing method of a substrate. The slurry for CMP of the present invention is particularly suitable for polishing an insulating film and an interlayer dielectric in the formation of a shallow trench isolation region, can afford, in the aforementioned steps, a polished film having an extremely small difference between the levels of the insulating film and the stopper film, and can improve the yield of substrate production.

This application is based on a patent application No. 2009-258444 filed in Japan, the contents of which are incorporated in full herein.

EXPLANATION OF SYMBOLS

1 substrate
2 oxidized insulating film (silicon oxide and the like)
3 stopper film (silicon nitride and the like)
4 trench (etched part)
5 insulating film (silicon oxide and the like)
6 shallow trench isolation region
D1 initial level difference
D2 level difference
D3 amount of increase in level difference

The invention claimed is:

1. A method of polishing a silicon oxide film on a silicon nitride film on a substrate, comprising relatively moving a substrate and a polishing pad while supplying a slurry suitable for chemical mechanical polishing between the substrate and the polishing pad to polish the silicon oxide film to expose the silicon nitride film, wherein the slurry comprises water-soluble clathrate compound (a), polymer compound (b) having carboxy group optionally in a salt form as a side chain, an inorganic compound particle (c) and water (d), the water-soluble clathrate compound (a) is contained in 0.001 mass %-3 mass % of the total amount of the slurry, the polymer compound (b) has a weight average molecular weight of not less than 1,000 and less than 1,000,000, the polymer compound (b) comprises polymer (b-1) comprising (meth)acrylic acid and/or a salt thereof in a unit amount of not less than 25 mass % in the polymer, and the polymer compound (b) is contained in 0.12 mass %-3 mass % of the total amount of the slurry, and the inorganic compound particle (c) consists of cerium oxide.

2. The method according to claim 1, wherein the water-soluble clathrate compound (a) has a weight average molecular weight of 200-1,000,000.

3. The method according to claim 1, wherein the water-soluble clathrate compound (a) is one or more selected from the group consisting of a cyclic oligosaccharide and a derivative thereof.

4. The method according to claim 3, wherein water-soluble clathrate compound (a) is one or more selected from the group consisting of α-cyclodextrin, β-cyclodextrin, γ-cyclodextrin, and a derivative thereof.

5. The method according to claim 1, wherein the polymer compound (b) is one or more selected from the group consisting of polyacrylic acid, a salt of polyacrylic acid with ammonium, a salt of polyacrylic acid with amine, polymethacrylic acid, a salt of polymethacrylic acid with ammonium, and a salt of polymethacrylic acid with amine.

6. The method according to claim 1, wherein the cerium oxide is a particle having an average particle size of 0.5 nm-1,000 nm.

7. The method according to claim 1, wherein the slurry has a pH of 3-12.5.

8. The method according to claim 1, wherein the polymer compound (b) is polymer (b-1) consisting of (meth)acrylic acid and/or a salt thereof.

* * * * *